(12) United States Patent
Kadoguchi et al.

(10) Patent No.: US 9,236,330 B2
(45) Date of Patent: Jan. 12, 2016

(54) POWER MODULE

(75) Inventors: Takuya Kadoguchi, Toyota (JP);
Takanori Kawashima, Anjo (JP);
Tomomi Okumura, Toyota (JP)

(73) Assignee: TOYOTA JIDOSHA KABUSHIKI KAISHA, Toyota-Shi (JP)

( * ) Notice: Subject to any disclaimer, the term of this patent is extended or adjusted under 35 U.S.C. 154(b) by 422 days.

(21) Appl. No.: 13/988,602

(22) PCT Filed: Nov. 29, 2010

(86) PCT No.: PCT/JP2010/071263
§ 371 (c)(1),
(2), (4) Date: May 21, 2013

(87) PCT Pub. No.: WO2012/073306
PCT Pub. Date: Jun. 7, 2012

(65) Prior Publication Data
US 2013/0235636 A1 Sep. 12, 2013

(51) Int. Cl.
*H01L 23/48* (2006.01)
*H01L 21/00* (2006.01)
(Continued)

(52) U.S. Cl.
CPC .......... *H01L 23/495* (2013.01); *H01L 23/4334* (2013.01); *H01L 23/49524* (2013.01); *H01L 23/49562* (2013.01); *H01L 23/49575* (2013.01); *H01L 24/32* (2013.01); *H01L 24/33* (2013.01); *H01L 24/34* (2013.01); *H02M 7/537* (2013.01); *H01L 24/45* (2013.01); *H01L 24/48* (2013.01); *H01L 24/49* (2013.01); *H01L 25/072* (2013.01); *H01L 2224/32245* (2013.01); *H01L 2224/37011* (2013.01); *H01L 2224/40137* (2013.01); *H01L 2224/45124* (2013.01); *H01L 2224/48091* (2013.01); *H01L 2224/48247* (2013.01);

(Continued)

(58) Field of Classification Search
CPC .............................. H01L 23/495; H01L 23/52
USPC .......... 438/123, 411, 461, 611; 257/696, 676, 257/735
See application file for complete search history.

(56) References Cited

U.S. PATENT DOCUMENTS 6,215,174 B1    4/2001  Takada et al.
6,756,658 B1 *  6/2004  Gillett ............... H01L 23/49562
                                                    257/666

(Continued)

FOREIGN PATENT DOCUMENTS

DE    102009009874 A1    9/2009
JP    09-298262 A        11/1997

(Continued)

*Primary Examiner* — Calvin Lee
(74) *Attorney, Agent, or Firm* — Kenyon & Kenyon LLP

(57) ABSTRACT

A power module according to the present invention includes a semiconductor device; a base part formed from an electrically conductive material on which the semiconductor device is mounted; a signal lead part formed from the same material as the base part, the signal lead part being electrically connected to the semiconductor device; and a thin plate lead part formed from the same material as the base part such that it is formed seamlessly from the base part and it is thinner than the base part, the thin plate lead part extending on the same side as the signal lead part with respect to the base part, wherein the thin plate lead part is electrically connected to a predetermined terminal of the semiconductor device via the base part such that it forms a potential detecting terminal for detecting a potential of the predetermined terminal of the semiconductor device.

12 Claims, 12 Drawing Sheets

(51) Int. Cl.
  H01L 23/495 (2006.01)
  H01L 23/00 (2006.01)
  H02M 7/537 (2006.01)
  H01L 23/433 (2006.01)
  H01L 25/07 (2006.01)
  H02M 7/00 (2006.01)

(52) U.S. Cl.
  CPC .......... *H01L2224/49171* (2013.01); *H01L 2224/73265* (2013.01); *H01L 2224/83385* (2013.01); *H01L 2924/01029* (2013.01); *H01L 2924/01082* (2013.01); *H01L 2924/1305* (2013.01); *H01L 2924/1306* (2013.01); *H01L 2924/13055* (2013.01); *H01L 2924/13091* (2013.01); *H01L 2924/181* (2013.01); *H02M 7/003* (2013.01)

(56) References Cited

U.S. PATENT DOCUMENTS

| | | | |
|---|---|---|---|
| 7,227,198 B2 * | 6/2007 | Pavier | ........... H01L 23/49562 174/260 |
| 2002/0024129 A1 | 2/2002 | Hirahara et al. | |
| 2004/0026770 A1 | 2/2004 | Tsuchida et al. | |
| 2007/0052072 A1 | 3/2007 | Iwade et al. | |
| 2008/0224282 A1 | 9/2008 | Ashida et al. | |
| 2009/0212284 A1 | 8/2009 | Otremba et al. | |
| 2010/0148298 A1 | 6/2010 | Takano et al. | |

FOREIGN PATENT DOCUMENTS

| | | |
|---|---|---|
| JP | 2004-119610 A | 4/2004 |
| JP | 2006-222149 A | 2/2005 |
| JP | 2006-134990 A | 5/2006 |
| JP | 2006-222149 A | 8/2006 |
| JP | 2007-073743 A | 3/2007 |
| JP | 2008060597 | 3/2008 |
| JP | 2008-091618 A | 4/2008 |
| JP | 2008-153432 A | 7/2008 |
| JP | 2008-227131 A | 9/2008 |
| JP | 2009-141053 A | 6/2009 |
| JP | 2009-146647 A | 7/2009 |
| JP | 2009-164647 A | 7/2009 |
| JP | 2009-278134 A | 11/2009 |
| WO | 02/95824 A1 | 11/2002 |

* cited by examiner

POWER MODULE

This is a 371 national phase application of PCT/JP2010/071263 filed 29 Nov. 2010, the contents of which are incorporated herein by reference.

FIELD OF THE INVENTION

The present invention is related to a power module.

BACKGROUND OF THE INVENTION

A power module is known which is formed using a lead frame (profile lead frame) which includes an island part on which a semiconductor device is installed; lead parts which mechanically and electrically connect to the semiconductor device via bonding wires; and a coupling part which integrally couples the island part to the lead parts (see Patent Document 1, for example).

[Patent Document 1] Japanese Laid-open Patent Publication No. 2009-141053

PROBLEM TO BE SOLVED BY INVENTION

According to a configuration disclosed in Patent Document 1, a suspending lead is cut away. Thus, in order to route a signal line of a high voltage from the island part which is connected to a back surface of the semiconductor device, it is necessary to weld a busbar to a power lead (see FIG. 1 in Patent Document 1, a terminal 3b connecting to a collector electrode of an IGBT) extending from the island part, and connect a signal line derived from the busbar to a control substrate via a connector or the like.

Therefore, an object of the present invention is to provide a power module in which a signal line of a high voltage can be routed from the semiconductor device without routing a signal line from a power lead.

SUMMARY OF THE INVENTION

According to one aspect of the present invention, a power module is provided which includes: a semiconductor device; a base part formed from an electrically conductive material on which the semiconductor device is mounted; a signal lead part formed from the same material as the base part, the signal lead part being electrically connected to the semiconductor device; a thin plate lead part formed from the same material as the base part such that it is formed seamlessly from the base part and it is thinner than the base part, the thin plate lead part extending on the same side as the signal lead part with respect to the base part; and a power lead part formed from the same material as the base part such that it is formed seamlessly from the base part and it is thinner than the base part, the power lead part connecting a predetermined terminal of the semiconductor device to a positive electrode side of a power supply, wherein the thin plate lead part is electrically connected to the predetermined terminal of the semiconductor device via the base part such that it forms a potential detecting terminal for detecting a potential of the predetermined terminal of the semiconductor device.

ADVANTAGE OF THE INVENTION

Therefore, an object of the present invention is to provide a power module in which a signal line of a high voltage can be routed from the semiconductor device without routing a signal line from a power lead.

BRIEF DESCRIPTION OF DRAWINGS

FIGS. 3(A) and 3(B) are cross-sectional views of the semiconductor module 1 along the respective lines in which FIG. 3(A) is a cross-sectional view along a line A-A in FIG. 2 and FIG. 3(B) is a cross-sectional view along a line B-B in FIG. 2.

FIGS. 4A and 4(B) are diagrams for illustrating an example of a connection between the semiconductor module 1 according to the first embodiment and a control substrate 90 in which FIG. 4(A) is a cross-sectional view along a line A-A in FIG. 2 and FIG. 4(B) is a cross-sectional view along a line B-B in FIG. 2.

FIGS. 5(A) and 5(B) are diagrams for illustrating a profile lead frame 30 in a status before molding of a resin molded portion 60 during a manufacturing process of the semiconductor module 1, in which FIG. 5(A) illustrates a sectional view and FIG. 5(B) illustrates a plan view.

Figure 1:
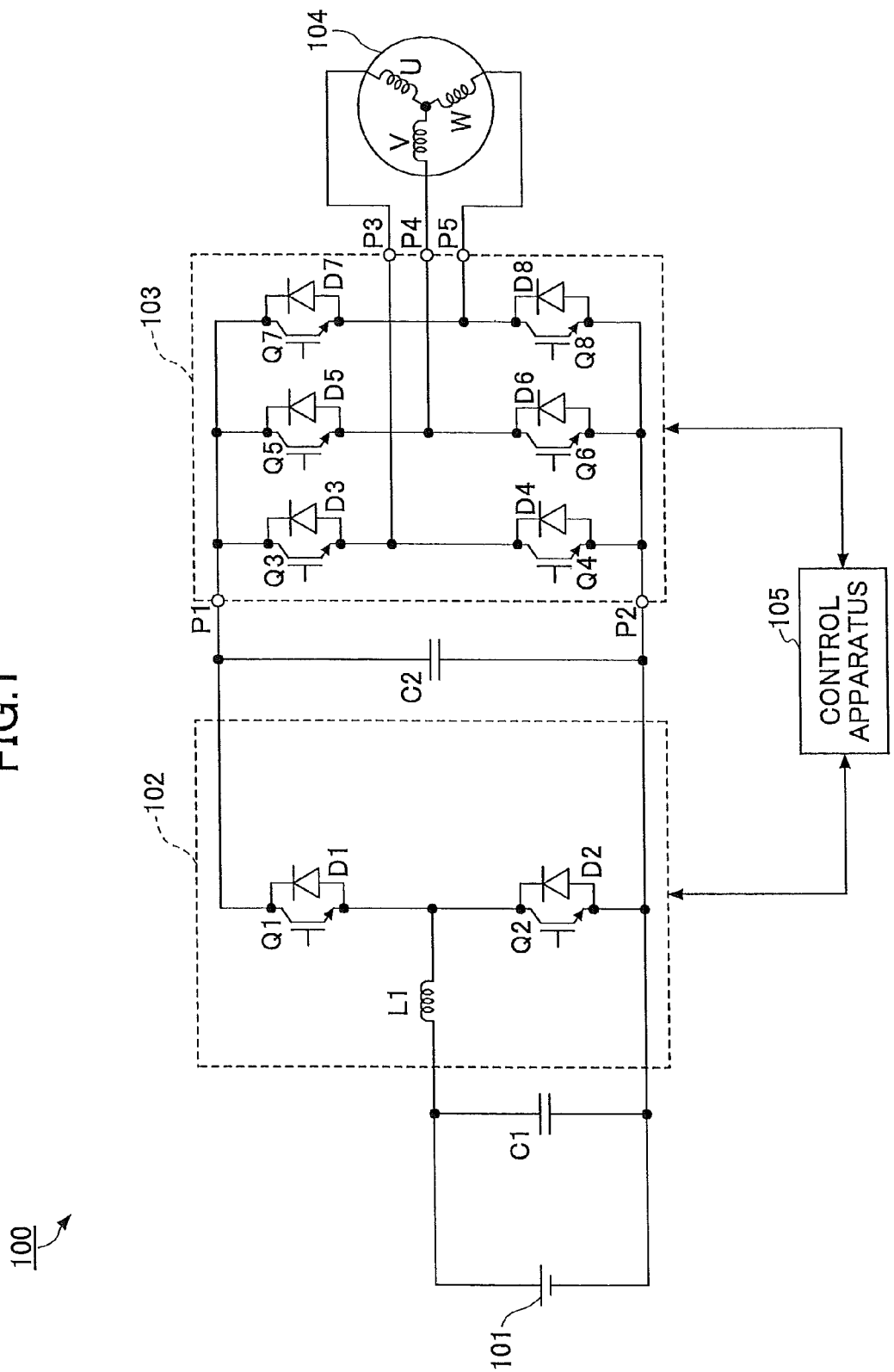
FIG. 1 is a diagram for illustrating a schematic configuration of a drive apparatus 100 for an electric vehicle according to an embodiment.

DESCRIPTION OF REFERENCE SYMBOLS 1,2,3,4 semiconductor module
10 semiconductor device
10A IGBT
10B diode
24 wire bonding
30 profile lead frame
30B profile lead frame
32 thick part
34 thin part
40 insulating sheet
50 cooling plate
54 fin
60 resin molded portion
82 solder layer
84a excess solder
90 control substrate
100 drive apparatus 100 for an electric vehicle 101 battery
102 DC-DC converter
103 inverter
104 motor for driving a vehicle
105 control apparatus
300A upper arm
300B lower arm
322 signal lead part
322a connection terminal portion
333 voltage sensing lead part
333a connection terminal portion
335 reinforcement portion
342 lead part
342a, 342b bent portion
343 hole
344 connection part
351, 352 power lead part
361, 362, 363 power lead part
600 signal lead forming portion 600
602, 604 suspending lead
605 coupling portion

DETAILED DESCRIPTION

In the following, the best mode for carrying out the present invention will be described in detail by referring to the accompanying drawings.

At first is explained a drive apparatus 100 for an electric vehicle in which a semiconductor module according to embodiments of the present invention described in detail hereinafter may be applied.

FIG. 1 is a diagram for illustrating a schematic configuration of the drive apparatus 100 for an electric vehicle according to an embodiment. The drive apparatus 100 for an electric vehicle is an apparatus for driving a motor 104 for driving a vehicle using power from a battery 101. It is noted that a type of the electric vehicle or a detailed configuration of the electric vehicle may be arbitrary as long as the electric vehicle is driven with the motor 104 using electric power. Typically, the electric vehicle includes a hybrid vehicle (HV) which uses an internal combustion engine and the motor 104 as a power source and a genuine electric vehicle which uses the motor 104 only as a power source.

The drive apparatus 100 for an electric vehicle includes the battery 101, a DC-DC converter 102, an inverter 103, the motor 104 and a control apparatus 105, as illustrated in FIG. 1.

The battery 101 is an arbitrary capacitor cell which accumulates power to output a direct-current voltage. The battery 10 may be configured by a nickel-hydrogen battery, a lithium-ion battery, a capacitive element such as electrical double layer capacitor, etc.

The DC-DC converter 102 is a bidirectional DC-DC converter (also referred to as variable chopper type of a step-up DC-DC converter), and is capable of converting an input voltage 14 V up to 42 V and converting an input voltage 42 V down to 14 V. The DC-DC converter 102 includes switching elements Q1 and Q2, diodes D1 and D2 and an inductor (coil) L1.

The switching elements Q1 and Q2 are IGBTs (Insulated Gate Bipolar Transistor) in this example. However, other switching element such as MOSFET (metal oxide semiconductor field-effect transistor) may be used.

The switching elements Q1 and Q2 are connected in series between a positive side line and a negative side line of the inverter 103. A collector of the switching element Q1 of the upper arm is connected to the positive side line and an emitter of the switching element Q2 of the lower arm is connected to the negative side line. One end of the inductor L1 is connected to a midpoint between the switching elements Q1 and Q2, that is to say, a connection point between the emitter of the switching element Q1 and the collector of the switching element Q2. Another end of the inductor L1 is connected to a positive electrode of the battery 101 via the positive side line. Further, the emitter of the switching element Q2 is connected to a negative electrode of the battery 101 via the negative side line. Further, diodes (flywheel diodes) D1 and D2 are provided between the corresponding collectors and emitters of the switching elements Q1 and Q2 such that the current flows from the emitter side to the collector side. Further, a smoothing capacitor C1 is connected between another end of the inductor L1 and the negative side line, and a smoothing capacitor C2 is connected between the collector of the switching element Q1 and the negative side line.

The inverter 103 includes arms of U-V-W phases disposed in parallel between the positive side line and the negative side line. The U-phase includes switching elements (IGBTs, in this example) Q3 and Q4 connected in series, the V-phase includes switching elements (IGBTs, in this example) Q5 and Q6 connected in series, and W-phase includes switching elements (IGBTs, in this example) Q7 and Q8 connected in series. Further, diodes (flywheel diodes) D3 through D8 are provided between the corresponding collectors and emitters of the switching elements Q3 through Q8 such that the current flows from the emitter side to the collector side. It is noted that the upper arm of the inverter 103 includes the switching elements Q3, Q5 and Q7 and the diodes D3, D5 and D7, and the lower arm of the inverter 103 includes the switching elements Q4, Q6 and Q8 and the diodes D4, D6 and D8.

The motor 104 is a three-phase permanent-magnetic motor and one end of each coil of the U, V and W phases is commonly connected at a midpoint therebetween. The other end of the coil of U-phase is connected to a midpoint between the switching elements Q3 and Q4, the other end of the coil of V-phase is connected to a midpoint between the switching elements Q5 and Q6 and the other end of the coil of W-phase is connected to a midpoint between the switching elements Q7 and Q8.

The control apparatus 105 controls the DC-DC converter 102 and the inverter 103. The control apparatus 105 includes a CPU, a ROM, a main memory, etc., and the functions of the control apparatus 105 are implemented when control programs stored in the ROM are read out from the main memory and then executed by the CPU. However, a part or all of the control apparatus 105 may be implemented by only hardware resources. Further, the control apparatus 105 may include plural apparatuses which are physically separated.

Figure 2:
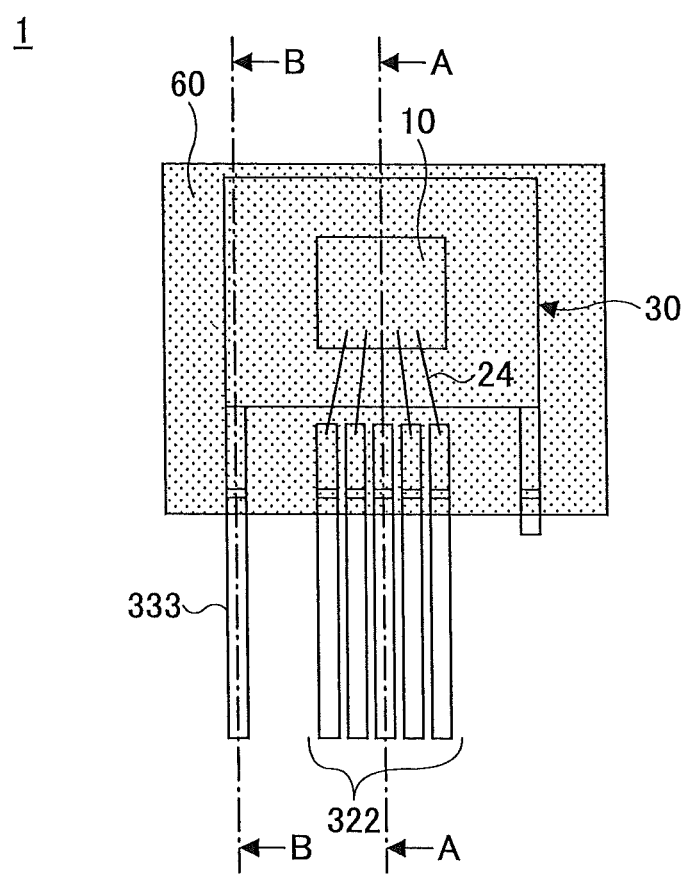
FIG. 2 is a plan view for illustrating a main configuration of a semiconductor module (power module) 1 according to one embodiment (a first embodiment) of the present invention.
Figure 3:
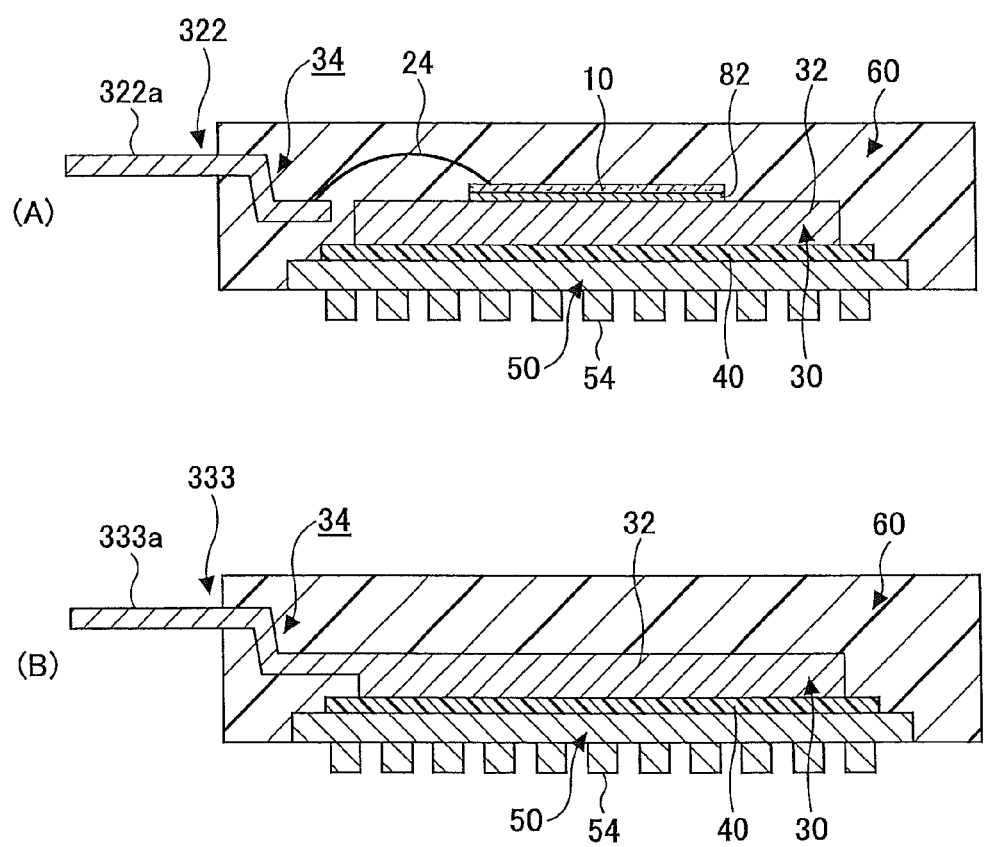

FIG. 2 is a plan view for illustrating a main configuration of a semiconductor module (power module) 1 according to one embodiment (a first embodiment) of the present invention. FIG. 3 is a cross-sectional view of the semiconductor module 1 along the respective lines in which (A) is a cross-sectional view along a line A-A and (B) is a cross-sectional view along a line B-B. It is noted that in FIG. 2 and FIG. 3 only the main portion is illustrated, and thus the illustration of wiring parts such as a power lead part (described hereinafter), etc., are omitted. Further, in FIG. 2, for the sake of better understanding, the inside of the resin molded portion 60 is illustrated as a transparent view (however, the illustration of an insulating sheet 40 and a cooling plate 50 is omitted).

The semiconductor module 1 may form a part of the inverter 103 described above. The semiconductor module 1 includes, as main components, semiconductor devices 10, a profile lead frame 30, an insulating sheet 40, a cooling plate 50 and a resin molded portion 60.

It is noted that in the illustrated example, the semiconductor module 1 is a part of the inverter 103 (see FIG. 1), and the semiconductor device 10 may include the IGBT and the diode which define the upper arm or lower arm of a U-phase, a V-phase and a W-phase arranged in parallel between a positive side line and a negative side line. It is noted that herein it is assumed that the semiconductor device 10 includes a pair of the IGBT and the diode which defines the upper arm of the inverter 103 (see FIG. 1). For example, the semiconductor device 10 includes the switching element (IGBT) Q3 and the diode D3 of the inverter 103 (see FIG. 1).

Figure 5:
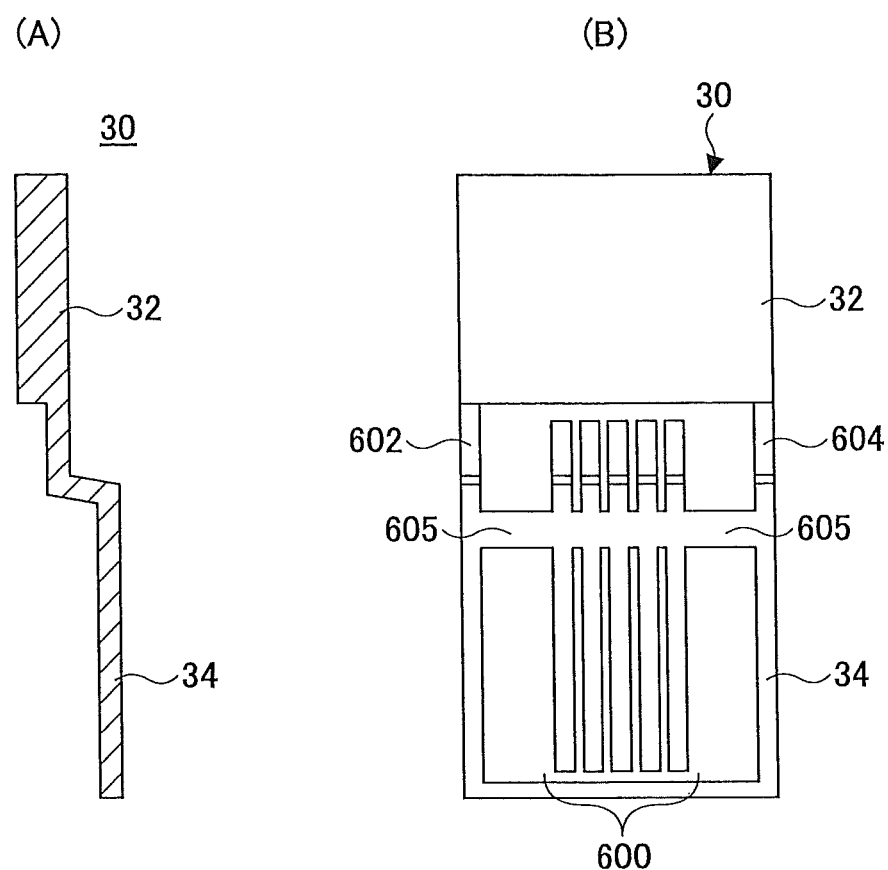

The profile lead frame 30 includes two parts with different thicknesses, that is to say, a thick part (base part) 32 and a thin part 34 (see FIG. 5). In a typical case, a ratio of the thickness between the thick part 32 and the thin part 34 is 4:1. However, the thick part 32 may have a thickness which is greater than four times of the thickness of the thin part 34 in order to increase a heat sink function described hereinafter. For example, a ratio of the thickness between the thick part 32 and the thin part 34 may be 6:1.

The thick part 32 of the profile lead frame 30 has a heat sink function of absorbing heat such as transient heat and spreading it. The profile lead frame 30 may be formed of any material other than a metal material as long as it has a heat sink function; however, preferably the profile lead frame 30 is formed of a metal material which has good thermal diffusivity, such as copper. On an upper surface of the profile lead frame 30 is disposed the semiconductor device 10 by soldering, etc. In the illustrated example, the semiconductor device 10 is installed on the upper surface of the profile lead frame 30 via a solder layer 82. The profile lead frame 30 mainly absorbs the heat generated in the semiconductor device 10 during the operation of the semiconductor device 10 and diffuses the heat toward the inside thereof.

Further, the thick part 32 of the profile lead frame 30 is electrically connected to a terminal of the semiconductor device 10 on the back side of the semiconductor device 10. In this example, the thick part 32 of the profile lead frame 30 is connected to a collector electrode of the IGBT.

The thin part 34 of the profile lead frame 30 forms wiring members and a voltage sensing lead part 333, etc. The wiring members may include wiring members (a signal lead part) 322 for signal transmission and wiring members (a power lead part) for a power supply line. It is noted that in FIG. 2 and FIGS. 3(A) and 3(B) the illustration of the power lead part is omitted. The power lead part formed by the thin part 34 forms a positive side terminal (input terminal) P1 of the inverter 103 described above (see FIG. 1), for example, and connects the inverter 103 and the battery 101. It is noted that, in the case of the lower arm, the power lead parts formed by the thin parts 34 form the respective terminals of U-phase, V-phase or W-phase of the inverter 103 described above (see FIG. 1), and connect the inverter 103 and the motor 104.

In FIG. 3(A), the wiring member 322 for signal transmission (referred to as a signal lead part 322, hereinafter) is illustrated. The signal lead part 322 has a pin-shaped body. As described hereinafter, the signal lead part 322 is electrically separated from the thick part 32 of the profile lead frame 30 during a manufacturing process of the semiconductor module 1. The wiring members 322 may be connected to the corresponding terminals of the semiconductor device 10 by wire bonding (aluminum wires) 24, etc. In this example, the wiring members 322 are connected to a gate electrode of the IGBT, etc. In FIG. 3(B), the voltage sensing lead part 333 is illustrated. The voltage sensing lead part 333 is formed seamlessly from the thick part 32 of the profile lead frame 30. Thus, the voltage sensing lead part 333 is equipotential with respect to the profile lead frame 30 and thus is equipotential with respect to the collector electrode of the IGBT. The semiconductor device 10 to which the voltage sensing lead part 333 is connected forms a part of the upper arm of the inverter 103 described above (see FIG. 1). The voltage sensing lead part 333 can detect the input voltage (i.e., voltage at the point P1 in FIG. 1) of the inverter 103.

The insulating sheet 40 is formed of a resin sheet, for example. The insulating sheet 40 enables high thermal conductivity from the thick part 32 of the profile lead frame 30 to the cooling plate 50 while ensuring electrical insulation between the thick part 32 of the profile lead frame 30 and the cooling plate 50. The insulating sheet 40 has an outer shape which is larger than a lower surface of the thick part 32 of the profile lead frame 30, as illustrated in FIGS. 3(A) and 3(B).

It is noted that, preferably, the insulating sheet 40 bonds to the thick part 32 of the profile lead frame 30 and the cooling plate 50 directly without using solder, metal films or the like. With this arrangement, it is possible to reduce thermal resistance and simplify a process in comparison with the case of using the solder. Further, the surface treatment on the cooling plate 50 suited for soldering becomes unnecessary. For example, the insulating sheet 40 is made of the same resin material (epoxy resin, for example) as the resin molded portion 60 described hereinafter, and bonds to the thick part 32 of the profile lead frame 30 and the cooling plate 50 under a pressure and at a temperature at the time of molding the resin molded portion 60 described hereinafter.

The cooling plate 50 is formed of a material which has good thermal diffusivity. For example, the cooling plate 50 may be formed of a metal such as aluminum. The cooling plate 50 has fins 54 on a lower surface thereof. The number of the fins 54 and an arrangement manner of the fins 54 are arbitrary unless otherwise specified. Further, a configuration of fins 54, such as a shape, height, etc., is arbitrary. The fins 54 may be straight fins or pin-shaped fins arranged in a staggered arrangement or the like. In an installed status of the semiconductor module 1 the fins 54 come into contact with a cooling medium such as cooling water or cooling air. In this way, the heat generated in the semiconductor devices 10 during the operations of the semiconductor devices 10 is transferred to the cooling medium from the fins 54 of the cooling plate 50 via the thick part 32 of the profile lead frame 30, the insulating sheet 40 and the cooling plate 50.

It is noted that the fins 54 may be integrally formed with the cooling plate 50 (aluminum die-casting, for example) or may be integrated with the cooling plate 50 by welding or the like. Further, the cooling plate 50 may be formed by coupling a sheet of a metal plate and another sheet of a metal having fins formed therein by means of bolts or the like.

The resin molded portion 60 is formed by molding a resin on the semiconductor device 10, the wiring members such as the signal lead part 322 except for the end thereof, the voltage sensing lead part 333 except for the end thereof, the thick part 32 of the profile lead frame 30, the insulating sheet 40 and the cooling plate 50, as illustrated in FIG. 3A, etc. Specifically, the resin molded portion 60 is a portion for sealing therein the main components (the semiconductor device 10, the wiring members such as the signal lead part 322 except for the end thereof, the voltage sensing lead part 333 except for the end thereof, the thick part 32 of the profile lead frame 30, the insulating sheet 40) with respect to the upper surface of the cooling plate 50. It is noted that the resin used may be epoxy resin, for example. However, with respect to the wiring members such as the signal lead part 322 and the voltage sensing lead part 333, connection terminal portions 322a, 333a for connecting to peripheral devices and appurtenant portions thereof required for extending the connection terminal portions 322a, 333a to predetermined positions (the connection terminal portions and the appurtenant portions thereof are referred to as merely "end portions", hereinafter) are exposed out of the resin molded portion 60. The final shapes of the respective end portions of the wiring members such as the signal lead part 322 and the voltage sensing lead part 333 are implemented by lead cutting and forming which are performed after the molding of the resin. This is described hereinafter with reference to FIG. 5(A), etc.

Figure 4:
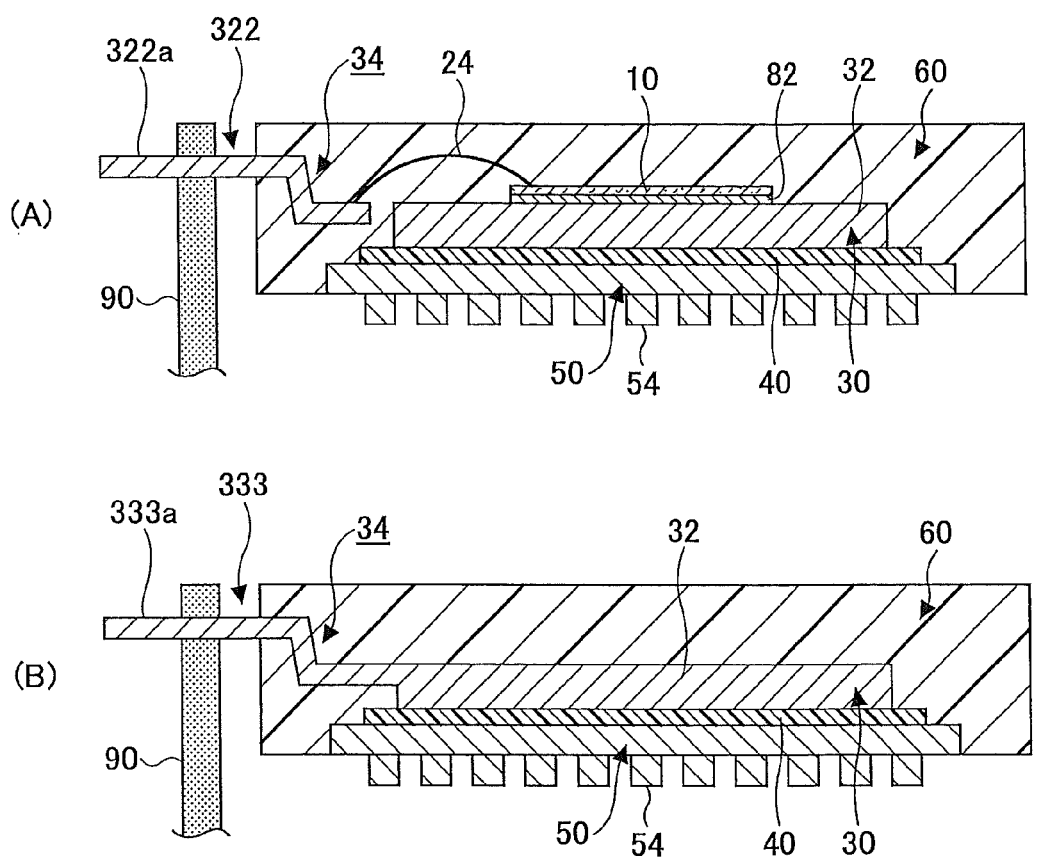

FIGS. 4(A) and 4(B) are diagrams for illustrating an example of a connection between the semiconductor module 1 and a control substrate 90 in which FIG. 4(A) is a cross-sectional view (corresponding to a cross-sectional view of FIG. 3(A)) along a line A-A in FIG. 2 and FIG. 4(B) is a cross-sectional view (corresponding to a cross-sectional view of FIG. 3(B)) along a line B-B.

As illustrated in FIG. 4(A), the terminal 322a of the signal lead part 322 exposed from the resin molded portion 60 is connected to the control substrate 90. The control substrate 90 may be a part of the control apparatus 105 illustrated in FIG. 1. For example, the terminal 322a of the signal lead part 322 passes through the control substrate 90 via a through hole in the control substrate 90, and is soldered to the control substrate 90.

Similarly, as illustrated in FIG. 4(B), the end of the voltage sensing lead part 333 exposed from the resin molded portion 60 is connected to the control substrate 90. Specifically, the connection terminal portion 333a of the voltage sensing lead part 333 passes through the control substrate 90 via a through hole in the control substrate 90, and is soldered to the control substrate 90. In this way, a signal line through which a signal indicating the input voltage of the inverter 103 is transmitted can be routed to the control apparatus 105. In other words, the voltage sensing lead part 333 can function as a voltage sensor (including a voltage monitor). The control apparatus 105 can perform various controls based on the signal (voltage) from the connection terminal portion 333a of the voltage sensing lead part 333. For example, the control apparatus 105 may monitor the input voltage of the inverter 103 based on the signal (voltage) from the connection terminal portion 333a of the voltage sensing lead part 333 to monitor whether there is an abnormality in the semiconductor module 1.

In this way, according to the first embodiment, since the voltage sensing lead part 333 is formed from the thin part 34 of the profile lead frame 30, it becomes possible to form the signal line of high voltage from the semiconductor device 10 (the signal line for transmitting the signal indicating the input voltage of the inverter 103), instead of forming it from the power lead part. In other words, since the voltage sensing lead part 333 can be soldered to the control substrate 90 as is the case with the signal lead part 322, it becomes unnecessary to form the signal line from the busbar and provide a connector for connecting the signal line to the control substrate 90. Therefore, it becomes possible to downsize the control substrate 90 and reduce the cost. Further, since the voltage sensing lead part 333 is formed from the thin part 34, it becomes possible to reduce the number of the parts as well as the influence of dimensional tolerances or manufacturing tolerances. In this connection, according to a configuration in which a separate metal block is used instead of the thick part 32 of the profile lead frame 30, positional accuracy between the metal block and the lead parts is reduced due to the manufacturing tolerances as well as the dimensional tolerances, and additional processes for connecting the metal block and the lead parts are required. Further, since the voltage sensing lead part 333 is connected to the control substrate 90 by soldering, the voltage sensing lead part 333 also functions as a reinforcement. In other words, the bonding area between the control substrate 90 and the profile lead frame 30 is increased. Therefore, the resistance against vibration is improved.

Further, according to the first embodiment, since the thick part 32 of the profile lead frame 30 serves a heat sink function, it becomes unnecessary to provide a separate metal block so as to ensure the required heat sink function.

It is noted that the inverter 103 may be formed by plural semiconductor modules 1 according to the first embodiment. In this case, plural semiconductor modules 1 may be connected to the same control substrate 90 in such a manner as illustrated in FIGS. 3(A) and 3(B). In this case, the voltage sensing lead part 333 may be provided only for a single semiconductor module 1 which forms the upper arm, among plural semiconductor modules 1. In this case, with respect to other semiconductor modules 1, portions corresponding to the voltage sensing lead parts 333 may be omitted, or may function as a reinforcement as is the case with a reinforcement portion 335 (see FIG. 7 described hereinafter) according to a second embodiment described hereinafter.

Further, the semiconductor modules 1 according to the first embodiment are provided such that they are perpendicular to the control substrate 90 (i.e., the direction of the normal to the fundamental surface of the profile lead frame 30 is perpendicular to the direction of the normal to the fundamental surface of the control substrate 90); however, the positional relationship between the semiconductor modules 1 and the control substrate 90 is arbitrary. For example, the semiconductor module 1 may be provided such that it is parallel to the control substrate 90.

Figure 6:
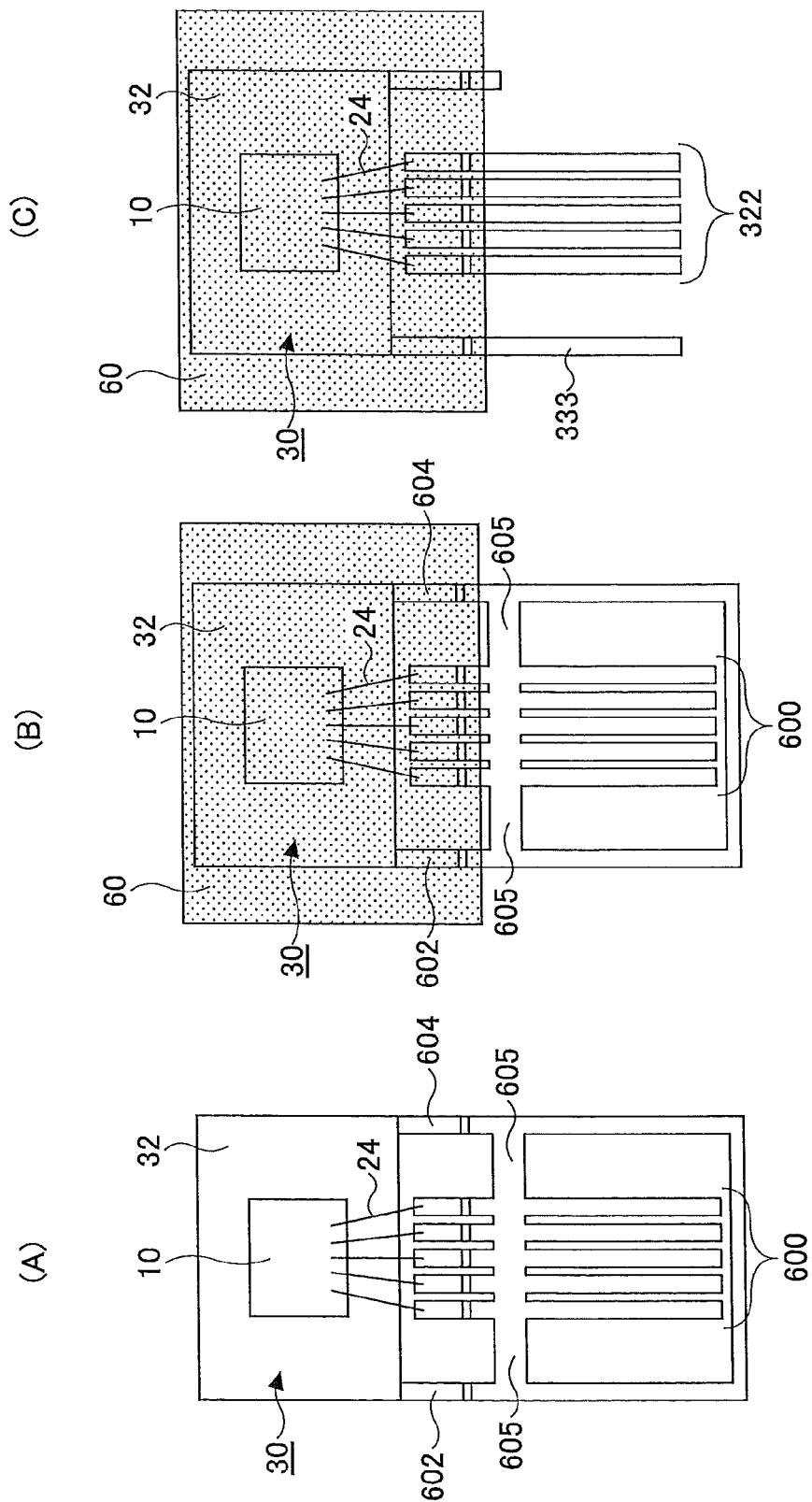
FIGS. 6(A), 6(B) and 6(C) are flow diagrams for illustrating an example of a main portion of the manufacturing process of the semiconductor module 1 according to the first embodiment.

Next, with reference to FIGS. 5(A) and 5(B) and FIGS. 6(A, 6(B) and 6(C), a main part of an example of a way of manufacturing the semiconductor module 1 according to the first embodiment is explained.

FIGS. 5(A) and 5(B) are diagrams for illustrating a profile lead frame 30 in a status before molding of a resin molded portion 60 during a manufacturing process of the semiconductor module 1, in which FIG. 5(A) illustrates a sectional view and FIG. 5(B) illustrates a plan view. It is noted that also in FIGS. 5(A) and 5(B) only the main portion is illustrated, and thus the illustration of wiring parts such as a power lead part (described hereinafter), etc., is omitted. FIGS. 6(A), 6(B) and 6(C) are flow diagrams for illustrating an example of a main portion of the manufacturing process of the semiconductor module 1 according to the first embodiment, in which FIGS. 6(A), 6(B) and 6(C) illustrate the respective stages of the manufacturing process. It is noted that, in FIGS. 6(A), 6(B) and 6(C) schematically illustrate a plan view of the semiconductor module 1 during the manufacturing process; however, for the sake of better understanding, the inside of the resin molded portion 60 is illustrated as a transparent view (however, the illustration of an insulating sheet 40 and a cooling plate 50 is omitted).

The profile lead frame 30 before the molding of the resin molded portion 60 includes a portion 600 (referred to as a signal lead forming portion 600, hereinafter) which forms the signal lead part 322, as illustrated in FIGS. 5(A) and 5(B). The signal lead forming portion 600 is supported by the thick part 32 via so-called suspending leads 602 and 604. In other words, the signal lead parts 322 are not directly supported by the thick part 32 in the completed status of the semiconductor module 1; however, the signal lead forming portion 600 is supported by the thick part 32 via coupling portions 605 and the suspending leads 602 and 604 during the manufacturing process of the semiconductor module 1.

Then, the semiconductor device 10 is installed on the profile lead frame 30 by the soldering or the like illustrated in FIGS. 5(A) and 5(B), and the signal lead forming portion 600 is connected to the semiconductor device 10 by the wire bonding 24, as illustrated in FIG. 6(A). Further, the profile lead frame 30 is coupled to the cooling plate 50 via the insulating sheet 40, as described above, although this is not illustrated. Then, the molding of the resin is performed to form the resin molded portion 60, as illustrated in FIG. 6(B). At that time, a part (end) of the signal lead forming portion 600 is not covered with the molded resin and thus is exposed from the resin molded portion 60, as illustrated in FIG. 6(B). On the other hand, the other end of the signal lead forming portion 600 (the end to which the wire bonding 24 is performed) is sealed and supported by the resin molded portion 60. Thus, at this stage, the original role of the suspending leads 602 and 604 (i.e., to support the signal lead forming portion 600) becomes no longer necessary. Thus, then, a part of the profile lead frame 30, which becomes no longer necessary, is removed, as illustrated in FIG. 6(C). In this way, the signal lead forming portion 600 is formed into the shape of the signal lead part 322. Thus, at this stage, the signal lead part 322 loses the connection (i.e., the connection via the suspending lead 604) to the thick part 32 of the profile lead frame 30. Further, the signal lead part 322 including plural lead portions is formed such that the respective lead portions are separated from each other. In contrast, the suspending lead 602 is not completely removed and formed into the shape of the voltage sensing lead part 333. Specifically, in the example illustrated in FIGS. 5(A) and 5(B) and FIGS. 6(A), 6(B) and 6(C), the suspending lead 604 is cut, while the suspending lead 602 has only the coupling portion 605, etc., removed. In this way, the suspending lead 602 is formed such that it can be available as the voltage sensing lead part 333.

According to the manufacturing process illustrated in FIGS. 5(A) and 5(B) and FIGS. 6(A), 6(B) and 6(C), the voltage sensing lead part 333 can be formed by utilizing the suspending lead 602 which has a role of suspending the signal lead forming portion 600 with respect to the thick part 32 of the profile lead frame 30 before the molding.

Figure 7:
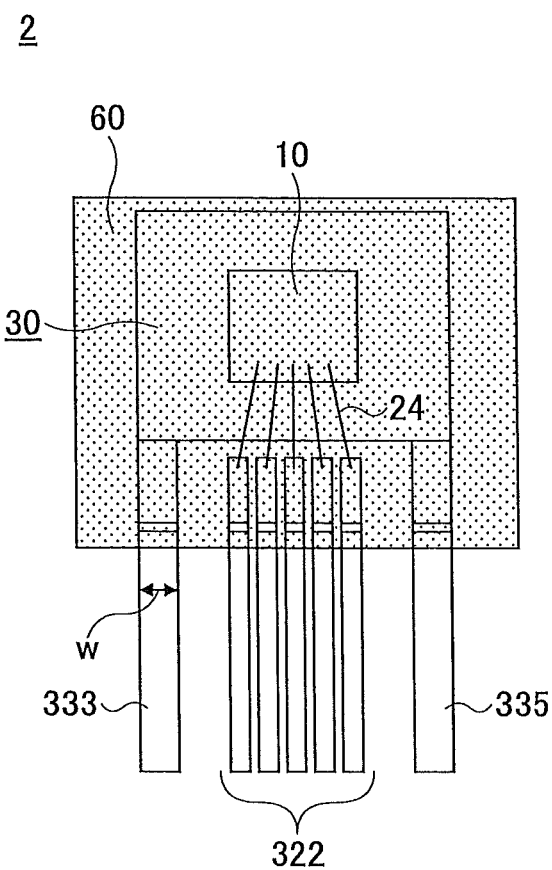
FIG. 7 is a plan view of a main portion of a semiconductor module 2 according to another embodiment (a second embodiment) of the present invention.
Figure 8:
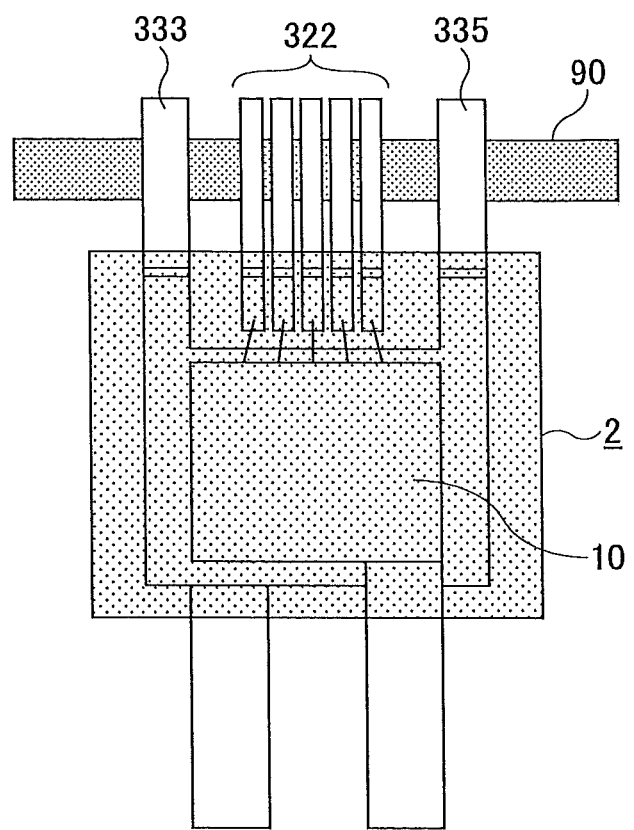
FIG. 8 is a substrate cross-sectional view for illustrating an example of a connection between the semiconductor module 2 according to the first embodiment and the control substrate 90.

FIG. 7 is a plan view for illustrating a main part of a semiconductor module 2 according to another embodiment (a second embodiment) of the present invention. FIG. 7 schematically illustrates a plan view of the semiconductor module 2 during the manufacturing process for the sake of the contrast with respect to FIG. 6(C) according to the first embodiment described above in order to feature the difference with respect to the semiconductor module 1 according to the first embodiment described above. It is noted that, as is the case with FIG. 6(C), in FIG. 7, for the sake of better understanding, the inside of the resin molded portion 60 is illustrated as a transparent view (however, the illustration of an insulating sheet 40 and a cooling plate 50 is omitted). FIG. 8 is a substrate cross-sectional view for illustrating an example of a connection between the semiconductor module 2 according to the second embodiment and the control substrate 90.

The semiconductor module 2 according to the second embodiment differs from the semiconductor module 1 according to the first embodiment mainly in that the width w of the voltage sensing lead part 333 is greater than the width of the signal lead part 322 (i.e., the width of the respective lead portions), as illustrated in FIG. 7. It is noted that, in the illustrated example, the suspending lead 604 on the right side is also not removed, and thus is formed into a portion 335 (referred to as a reinforcement portion 335, hereinafter) which has a shape similar to the voltage sensing lead part 333. The reinforcement portion 335 is an optional portion which is provided for the reinforcement described hereinafter.

The width w of the voltage sensing lead part 333 is greater than the width of the signal lead part 322 (i.e., the width of the respective lead portions). The width w of the voltage sensing lead part 333 may be adapted to an appropriate width suited for implementing the reinforcement function described hereinafter. However, in general, the width w of the voltage sensing lead part 333 is smaller than the width of the power lead part (see FIG. 9) through which a large current passes.

As illustrated in FIG. 8, according to the semiconductor module 2 according to the second embodiment, a connection terminal portion 322a of the signal lead part 322, which is exposed from the resin molded portion 60, is connected to the control substrate 90, as is the case with semiconductor module 1 according to the first embodiment. The control substrate 90 may be a part of the control apparatus 105 illustrated in FIG. 1. For example, the terminal 322a of the signal lead part 322 passes through the control substrate 90 via a through hole in the control substrate 90, and is soldered to the control substrate 90.

Similarly, as illustrated in FIG. 8, the end of the voltage sensing lead part 333 exposed from the resin molded portion 60 is connected to the control substrate 90. Specifically, the connection terminal portion 333a of the voltage sensing lead part 333 passes through the control substrate 90 via a through hole in the control substrate 90, and is soldered to the control substrate 90. In this way, a signal line through which a signal indicating the input voltage of the inverter 103 is transmitted can be routed to the control apparatus 105. Further, the end of the reinforcement portion 335 exposed from the resin molded portion 60 is connected to the control substrate 90. Specifically, the end of the reinforcement portion 335 passes through the control substrate 90 via a through hole in the control substrate 90, and is soldered to the control substrate 90.

In this way, according to the semiconductor module 2 according to the second embodiment, as is the case with the semiconductor module 1 according to the first embodiment, since the voltage sensing lead part 333 is formed from the thin part 34 of the profile lead frame 30, it becomes possible to connect the voltage sensing lead part 333 to the control substrate 90 by the soldering as is the case with the signal lead part 322. Therefore, it becomes unnecessary to form the signal line from the busbar and provide a connector for connecting the signal line to the control substrate 90. Therefore, it becomes possible to downsize the control substrate 90 and reduce the cost. Further, since the voltage sensing lead part 333 is formed from the thin part 34, it becomes possible to reduce the number of the parts as well as the influence of dimensional tolerances or manufacturing tolerances. Further, since the voltage sensing lead part 333 is connected to the control substrate 90 by soldering, the voltage sensing lead part 333 also functions as a reinforcement, thereby improving the resistance against vibration. In particular, according to the second embodiment, since the width w of the voltage sensing lead part 333 is greater than that of the signal lead part 322, the resistance against vibration is increased advantageously. Further, in the case where the reinforcement portion 335 is also connected to the control substrate 90 by soldering, the resistance against vibration is further increased. These configurations are suited if the semiconductor module 2 is used in a hard vibration environment, in particular. This is because in such an environment cracks in the soldered bonded portion between the control substrate 90 and the signal lead part 322 tend to become larger more quickly due to the vibration or impact.

Further, according to the semiconductor module 2 according to the second embodiment, as is the case with the semiconductor module 1 according to the first embodiment, since the thick part 32 of the profile lead frame 30 serves a heat sink function, it becomes unnecessary to provide a separate metal block so as to ensure the required heat sink function.

It is noted that the inverter 103 may be formed by plural semiconductor modules 2 illustrated in FIG. 7 and FIG. 8. In this case, plural semiconductor modules 2 may be connected to the same control substrate 90 in such a manner as illustrated in FIG. 8. In this case, the voltage sensing lead part 333 may be provided only for a single semiconductor module 1 which forms the upper arm, among plural semiconductor modules 2. In this case, with respect to other semiconductor modules 2, portions corresponding to the voltage sensing lead parts 333 may be omitted, or may function as a reinforcement as is the case with the reinforcement portion 335.

Further, in the second embodiment, if the reinforcement portion 335 is provided, the reinforcement portion 335 and the voltage sensing lead part 333 don't necessarily have the same width. For example, the width w of the voltage sensing lead part 333 may be greater than that of the signal lead part 322, and the width of the reinforcement portion 335 may be substantially the same as the signal lead part 322. Alternatively, the width of the reinforcement portion 335 may be greater than that of the signal lead part 322, and the width w of the voltage sensing lead part 333 may be substantially the same as that of the signal lead part 322.

Further, the semiconductor module 2 according to the second embodiment is provided such that it is perpendicular to the control substrate 90; however, the positional relationship with respect to the control substrate 90 is arbitrary. For example, the semiconductor module 2 may be provided such that it is parallel to the control substrate 90.

Figure 9:
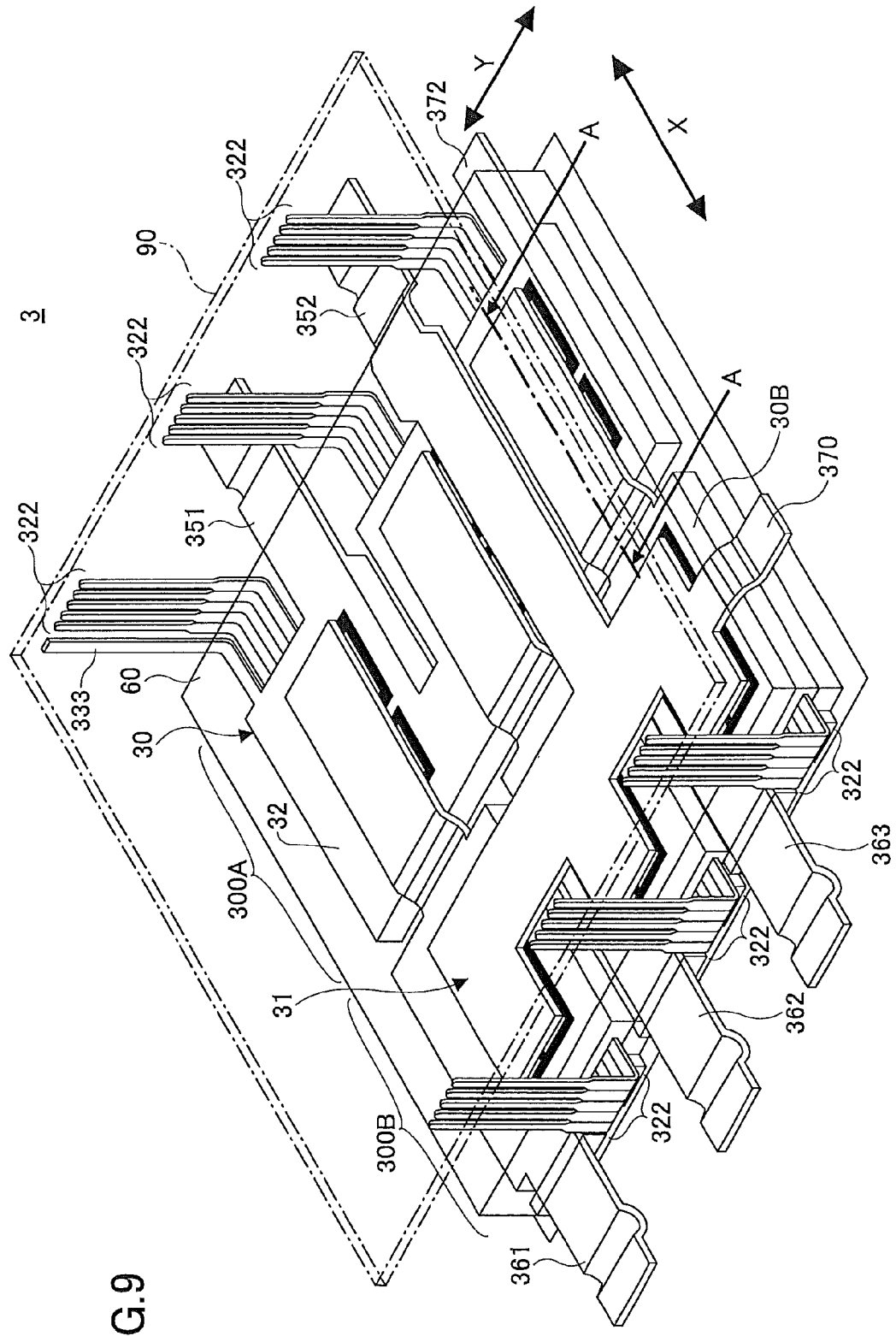
FIG. 9 is a perspective view for illustrating an appearance of a main portion of a semiconductor module 3 according to yet another embodiment (a third embodiment) of the present invention.

FIG. 9 is a perspective view for illustrating an appearance of a main portion of a semiconductor module 3 according to yet another embodiment (a third embodiment) of the present invention. It is noted that in FIG. 9, for the sake of better understanding, the inside of the resin molded portion 60 is illustrated as a transparent view.

The semiconductor module 3 includes an upper arm 300A and a lower arm 300B packaged integrally. In this way, a unit packaged in the semiconductor module 3 may be arbitrary. The upper arm 300A of the semiconductor module 3 includes a configuration related to the profile lead frame 30 of the semiconductor module 1 and 2 according to the first and second embodiments. Further, the lower arm 300B of the semiconductor module 3 includes substantially the same configuration as the construction related to the profile lead frame 30 of the semiconductor module 1 and 2 according to the first and second embodiments, except that the voltage sensing lead part 333 is not necessary. It is noted that the lower arm 300B is formed using a profile lead frame 30B which is separate from the profile lead frame 30 of the upper arm 300A. The upper arm 300A and the lower arm 300B are sealed by the same resin molded portion 60.

In the example illustrated in FIG. 9, the semiconductor module 3 is provided such that it is parallel to the control substrate 90 (illustrated by an alternate long and short dashed line). In other words, the direction of the normal to the fundamental surface of the profile lead frame 30 is parallel to the direction of the normal to the fundamental surface of the control substrate 90. The voltage sensing lead part 333 is bent to extend in an upper direction toward the control substrate 90. It is noted that the voltage sensing lead part 333 may be connected to the control substrate 90 by the soldering as is the case with the first and second embodiments described above, although illustration of this is omitted.

In the example illustrated in FIG. 9, a power lead part 351, which corresponds to the positive side terminal (input terminal) P1 of the inverter 103 (see FIG. 1), is exposed from the resin molded portion 60 to extend from one side of the semiconductor module 3 in an X direction. Further a power lead part 352, which corresponds to the negative side terminal P2 of the inverter 103 (see FIG. 1), is exposed from the resin molded portion 60 to extend from one side of the semiconductor module 3 in the X direction. Further, the signal lead parts 322 and the voltage sensing lead part 333 of the upper arm 300A are exposed from the resin molded portion 60 to extend from one side of the semiconductor module 3 in the X direction. It is noted that the power lead part 351 is formed from the thin part 34 of the profile lead frame 30 which forms the upper arm 300A of the semiconductor module 3, and the power lead part 352 is formed from a separate profile lead frame 31 other than the profile lead frame 30. Further power lead parts 361, 362 and 363, which correspond to the respective terminal of the U, V and W phases of the inverter 103 (see FIG. 1), are exposed from the resin molded portion 60 to extend from another side of the semiconductor module 3 in the X direction. Further, the signal lead parts 322 of the lower arm 300B are exposed from the resin molded portion 60 to extend from the other side of the semiconductor module 3 in the X direction. Power lead parts 361, 362 and 363 are formed from the thin part of the profile lead frame 30B which forms the lower arm 300B. It is noted that, in the illustrated example, a terminal 370 of the separate profile lead frame 31, which is connected to the emitter side of the semiconductor device 10 of the lower arm 300B, extends from one side of the semiconductor module 3 in a Y direction; however, the terminal 370 may extend from another side of the semiconductor module 3 in the X direction as is the case with the power lead parts 361, 362 and 363. It is noted that clamping portions of the semiconductor module 3 to a cooling water channel may be provided on the end of the semiconductor module 3 in the Y direction, although this is not illustrated.

Figure 10:
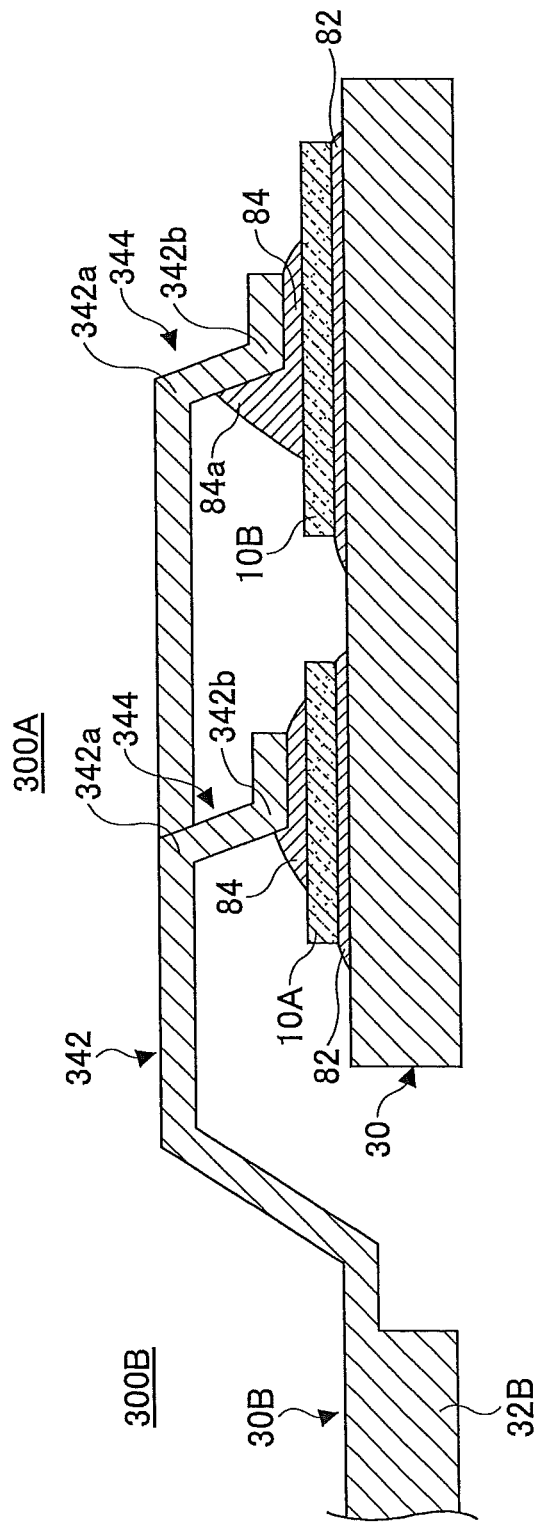
FIG. 10 is a cross-sectional view along a line A-A in FIG. 9 for illustrating an example of a connection between an upper arm 300A and a lower arm 300B.

FIG. 10 is a cross-sectional view along a line A-A in FIG. 9 for illustrating an example of a connection between the upper arm 300A and the lower arm 300B. In FIG. 10, for the sake of less complexity in the drawing, the illustration of the insulating sheet 40, the cooling plate 50 and the resin molded portion 60 is omitted.

Connection parts 344 of lead parts 342, which are formed from the thin part of the profile lead frame 30 of the lower arm 300B, each include a bent portion 342a, which extends in an inclined down direction from a horizontal direction, and a bent portion 342b, which extends in a horizontal direction from the inclined down direction, as illustrated in FIG. 10. The connection parts 344 of the lead parts 342 are connected to the semiconductor devices 10 (i.e., the IGBT 10A and the diode 10B) by the soldering. Here, in the case of excess solder 84a generating in soldering, the excess solder 84a moves in the up direction along the back side of the lead part 342 to form a fillet, as schematically illustrated in FIG. 10. In this way, according to the example, by providing the bent portions 342a and 342b, it becomes possible to accommodate the excess solder 84a with the bent portions 342a and 342b.

Figure 11:
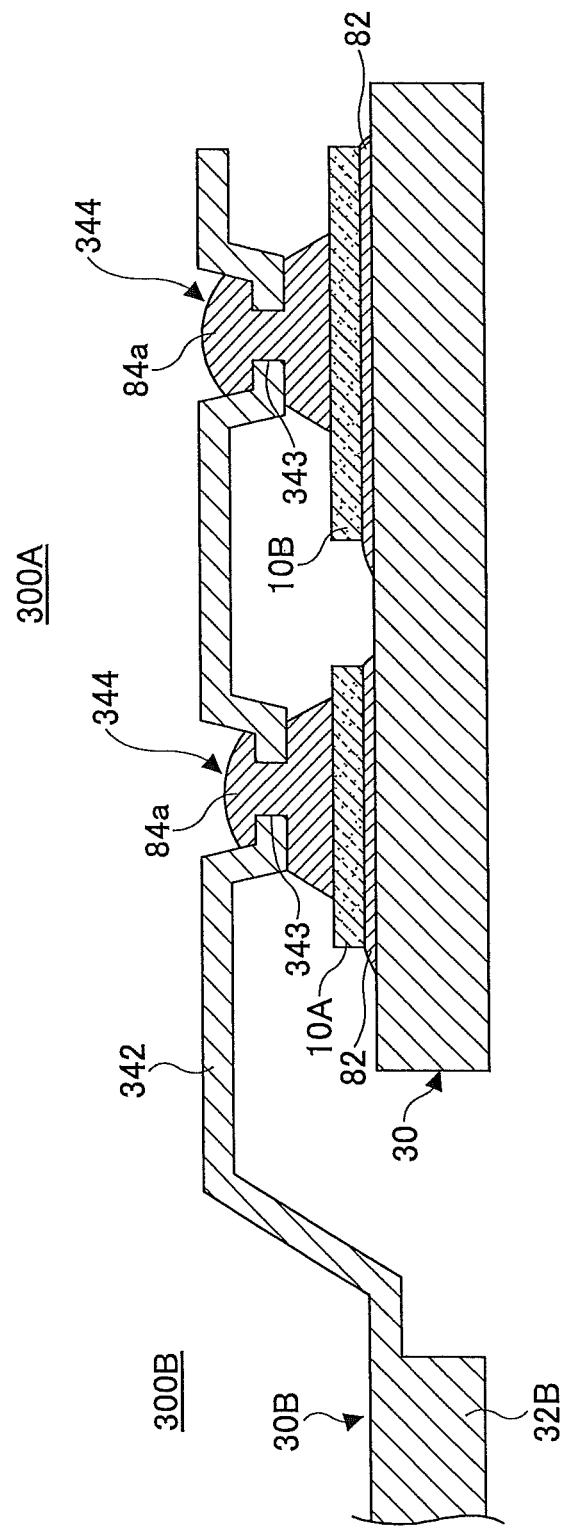
FIG. 11 is a cross-sectional view along a line A-A in FIG. 9 for illustrating another example of a connection between the upper arm 300A and the lower arm 300B.

FIG. 11 is a cross-sectional view along a line A-A in FIG. 9 for illustrating another example of a connection between the upper arm 300A and the lower arm 300B. In FIG. 11, for the sake of less complexity in the drawing, the illustration of the insulating sheet 40, the cooling plate 50 and the resin molded portion 60 is omitted.

Connection parts 344 of lead parts 342, which are formed from the thin part of the profile lead frame 30B of the lower arm 300B, each include holes 343, as illustrated in FIG. 11. The holes 343 are provided in the connection parts 344 which are formed by forming the lead part 342 into a concave shape, as illustrated in FIG. 11. The connection parts 344 of the lead parts 342 are connected to the semiconductor devices 10 (i.e., the IGBT 10A and the diode 10B) by the soldering. Specifically, the lead parts 342 are connected to the semiconductor devices 10 (i.e., the IGBT 10A and the diode 10B) of the upper arm 300A by performing the soldering in the holes of the connection parts 344. If the excess solders 84a are generated in soldering, the excess solders 84a squeeze out of the holes 343 into concave spaces in the connection parts 344, as schematically illustrated in FIG. 11. In this way, according to the example, by forming the hole 343 at the bottom of the connection part 344 with a concave shape formed in the lead part 342, it becomes possible to accommodate the excess solder 84a.

According to the semiconductor module 3 of the third embodiment, the following effects, among others, can be obtained in addition to the effects according to the first and second embodiments. Further, since the connection between the upper arm 300A and the lower arm 300B is implemented by the lead part 342 formed from the thin part of the profile lead frame 30B of the lower arm 300B, it becomes possible to reduce the number of the parts as well as the influence of dimensional tolerances or manufacturing tolerances. In this connection, according to a configuration in which a separate metal block is used instead of the thick part 32B of the profile lead frame 30B, positional accuracy between the metal block and the lead parts is reduced due to the manufacturing tolerances as well as the dimensional tolerances, and additional processes for connecting the metal block and the lead parts are required. Further, in the third embodiment, in the case of adopting the connection between the upper arm 300A and the lower arm 300B illustrated in FIG. 10 or FIG. 11, the excess solder varied due to the tolerance can be accommodated, thereby increasing the reliability of the soldered connections. Further, in the case of adopting the connection between the upper arm 300A and the lower arm 300B illustrated in FIG. 10 or FIG. 11, the stress is relieved due to the elastic deformation of the lead part 342, thereby increasing the life of the soldered connections.

Figure 12:
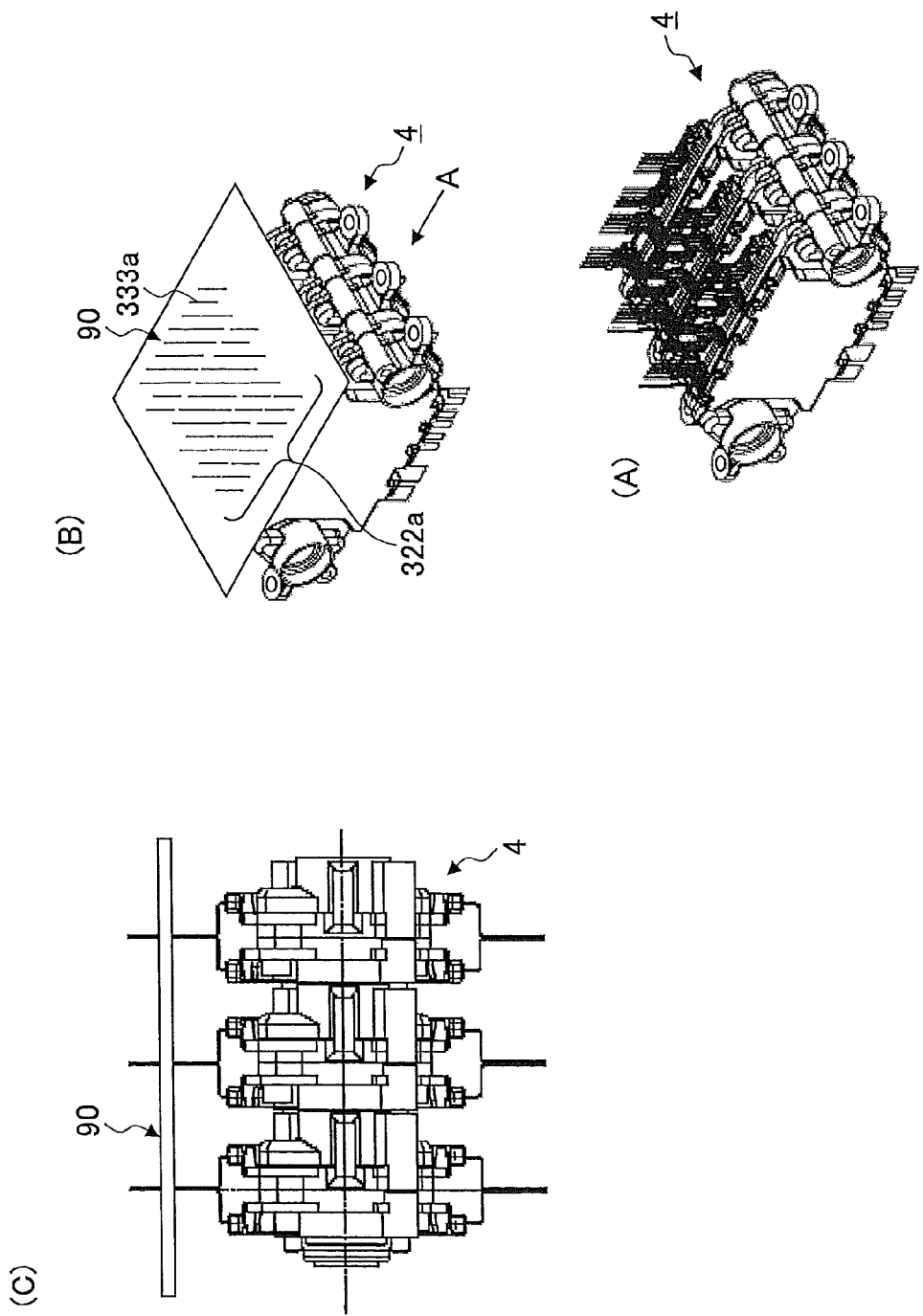
FIGS. 12(A), 12(B) and 12(C) are diagrams for more concretely illustrating an example of a connection between a semiconductor module 4 and the control substrate 90.

FIGS. 12(A), 12(B) and 12(C) are diagrams for more concretely illustrating an example of a connection between a semiconductor module 4 and the control substrate 90, in which FIG. 12(A) illustrates a perspective view of the semiconductor module 4, FIG. 12(B) illustrates a perspective view of a status in which the control substrate 90 is connected to the semiconductor module 4, and FIG. 12(C) illustrates a side view viewed in a direction parallel to the semiconductor module 4 and the control substrate 90.

The semiconductor module 4 illustrated in FIGS. 12(A), 12(B) and 12(C) may be formed using the semiconductor module 1 or 2 according to the first or second embodiment. As illustrated in FIGS. 12(B) and 12(C), the semiconductor module 4 is provided such that it is perpendicular to the control substrate 90, as is the case with the semiconductor module 1 or 2 according to the first or second embodiment (see FIGS. 4(A), etc). According to the semiconductor module 4, one voltage sensing lead part 333 and plural signal lead parts 322 extend to the side of the control substrate 90. The voltage sensing lead part 333 and the signal lead parts 322 pass through the control substrate 90 via a through hole in the control substrate 90 to be connected the control substrate 90, as FIGS. 12(B) and 12(C). It is noted that the voltage sensing lead part 333 may be connected to the control substrate 90 by the soldering as is the case with the first and second embodiments described above, although illustration of this is omitted.

The present invention is disclosed with reference to the preferred embodiments. However, it should be understood that the present invention is not limited to the above-described embodiments, and variations and modifications may be made without departing from the scope of the present invention.

For example, according to the embodiments, the voltage sensing lead part 333 is connected to the collector of the IGBT; however, if another switching element is used, the voltage sensing lead part 333 may be connected to an appropriate terminal correspondingly so that the input voltage of the inverter 103 can be detected. For example, if the switching element is a MOSFET, the thick part 32 of the profile lead frame 30 is connected to a drain of the MOSFET. In this case, the voltage sensing lead part 333 may be the drain of the MOSFET.

Further, according to the embodiments, the voltage sensing lead part 333 is utilized as a voltage sensor for detecting the input voltage (i.e., the boosted voltage) of the inverter 103 which has been boosted by a booster system (i.e., the DC-DC converter 102); however, the DC-DC converter 102 may be omitted. In this case, the voltage sensing lead part 333 may be utilized as a voltage sensor for detecting the input voltage of the inverter 103 which has not been boosted.

Further, in the third embodiment, the semiconductor devices 10 are configured with a total of six arms of upper arms and lower arms wherein each arm includes U-phase, V-phase and W-phase. However, the number of the arms installed in the semiconductor module 3 may be any. If the semiconductor module 3 is embodied as an inverter for driving two motors for driving a vehicle, for example, the semiconductor devices 10 may form the respective upper and lower arms of U-phase, V-phase and W-phase for the first motor and the respective upper and lower arms of U-phase, V-phase and W-phase for the second motor. Further, several semiconductor devices 10 may be installed in parallel for one arm. In any case, the configuration related to the profile lead frame 30 of the semiconductor module 1 or 2 according to the first or second embodiment may be used for the upper arm.

Further, the semiconductor module 1 may include another configuration (parts of elements of a DC-DC booster transformer for driving a motor for driving a vehicle, for example), and the semiconductor module 1 may include another element (capacitor, inductor, etc.) in addition to the semiconductor devices 10. Further, the semiconductor module 1 is not limited to the semiconductor module which forms the inverter. Further, the semiconductor module 1 may be implemented as an inverter used for applications (a train, an air conditioner, an elevator, a refrigerator, etc.) other than vehicle applications. These are also true for the second or third embodiment.

The invention claimed is:
1. A power module comprising:
a semiconductor device;
a base part formed from an electrically conductive material on which the semiconductor device is mounted;
a signal lead part formed from the same material as the base part, the signal lead part being electrically connected to the semiconductor device;
a thin plate lead part formed from the same material as the base part such that it is formed seamlessly from the base part and it is thinner than the base part, the thin plate lead part extending on the same side as the signal lead part with respect to the base part; and a power lead part formed from the same material as the base part such that it is formed seamlessly from the base part and it is thinner than the base part, the power lead part connecting a predetermined terminal of the semiconductor device to a positive electrode side of a power supply, wherein the thin plate lead part is electrically connected to a predetermined terminal of the semiconductor device via the base part such that it forms a potential detecting terminal for detecting a potential of the predetermined terminal of the semiconductor device.

2. The power module of claim 1, wherein the thin plate lead part functions as a voltage sensor.

3. The power module of claim 1, wherein the thin plate lead part is wider than the signal lead part.

4. The power module of claim 1, wherein the semiconductor device is an IGBT, and the predetermined terminal is a collector terminal.

5. The power module of claim 1, wherein there is no heat sink part other than the base part.

6. The power module of claim 1, wherein the base part, the thin plate lead part and the signal lead part are formed of a profile lead frame, the profile lead frame having a thin portion and a thick portion which have difference in a thickness,
   the base part is formed of the thick portion, and the thin plate lead part and the signal lead part are formed of the thin portion.

7. The power module of claim 1 that includes a first arm part and a second arm part, wherein
   the semiconductor device, the base part, the signal lead part and the thin plate lead part form the first arm part, and
   the second arm part includes
   a second semiconductor device;
   a second base part formed from an electrically conductive material on which the second semiconductor device is mounted; and
   a second thin plate lead part formed from the same material as the second base part such that it is formed seamlessly from the second base part and it is thinner than the second base part, wherein the second thin plate lead part of the second arm part includes a connection part that extends via a bent part or includes a hole formed therein, the connection part being soldered to the semiconductor device of the first arm part.

8. The power module of claim 1, wherein the end of the thin plate lead part and the end of the signal lead part are soldered to a control substrate for controlling the power module.

9. The power module of claim 8, wherein the power lead part extends on the same side as the signal lead part with respect to the base part,
   an end of the power lead part is exposed from the resin molded portion, and
   the thin plate lead part is wider than the power lead part.

10. The power module of claim 1, further comprising:
    a resin molded portion that is provided such that it covers the semiconductor device, the base part, the thin plate lead part except for an end thereof, and the signal lead part except for an end thereof, wherein
    the end of the thin plate lead part and the end of the signal lead part are exposed from the resin molded portion, and
    the end of the thin plate lead part and the end of the signal lead part are connected to a control substrate for controlling the power module.

11. The power module of claim 10, wherein the end of the thin plate lead part is soldered to the control substrate.

12. The power module of claim 11, further comprising:
    a second thin plate lead part formed from the same material as the base part such that it is formed integrally with the base part and it is thinner than the base part, the second thin plate lead part extending seamlessly from the base part, wherein
    the second thin plate lead part extends such that the signal lead part extends between the second thin plate lead part and the thin plate lead part,
    an end of the second thin plate lead part is exposed from the resin molded portion, and
    the end of the second thin plate lead part is soldered to the control substrate.

* * * * *